(12) United States Patent
Van Herpen et al.

(10) Patent No.: US 7,759,663 B1
(45) Date of Patent: Jul. 20, 2010

(54) SELF-SHADING ELECTRODES FOR DEBRIS SUPPRESSION IN AN EUV SOURCE

(75) Inventors: Maarten Marinus Johannes Wilhelmus Van Herpen, Heesch (NL); Wouter Anthon Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 286 days.

(21) Appl. No.: 11/634,385

(22) Filed: Dec. 6, 2006

(51) Int. Cl.
*H01J 35/00* (2006.01)

(52) U.S. Cl. .............. 250/504 R; 250/492.1; 250/493.1; 313/232; 313/163; 313/172; 313/165; 313/326; 378/119; 378/134; 378/135; 378/136

(58) Field of Classification Search ......... 250/426, 250/492.1, 493.1, 504 R; 313/232, 163, 313/172, 171, 165, 326; 378/119, 134, 135, 378/136
See application file for complete search history.

(56) References Cited

U.S. PATENT DOCUMENTS

| 6,586,757 | B2* | 7/2003 | Melnychuk et al. ..... 250/504 R |
| 6,972,421 | B2* | 12/2005 | Melnychuk et al. ..... 250/504 R |
| 7,075,096 | B2* | 7/2006 | McGeoch ............... 250/504 R |
| 2004/0105082 | A1* | 6/2004 | Koshelev et al. .......... 355/53 |
| 2006/0243923 | A1* | 11/2006 | Seki ....................... 250/493.1 |

FOREIGN PATENT DOCUMENTS

WO  2005/025280 A2  3/2005

* cited by examiner

*Primary Examiner*—Robert Kim
*Assistant Examiner*—Michael Maskell
(74) *Attorney, Agent, or Firm*—Pillsbury Winthrop Shaw Pittman LLP

(57) ABSTRACT

A radiation source having self-shading electrodes is disclosed. Debris originating from the electrodes is reduced. The path from the electrodes to the EUV optics is blocked by part of the electrodes themselves (termed self-shading). This may significantly reduce the amount of electrode-generated debris.

20 Claims, 3 Drawing Sheets

Fig 1
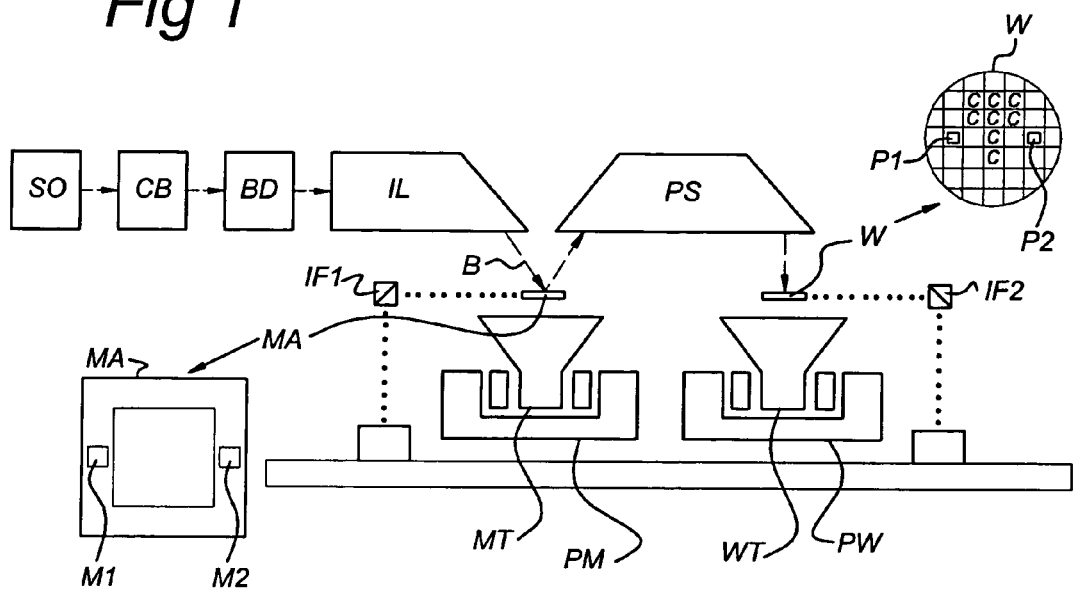
Fig 2 State of the art
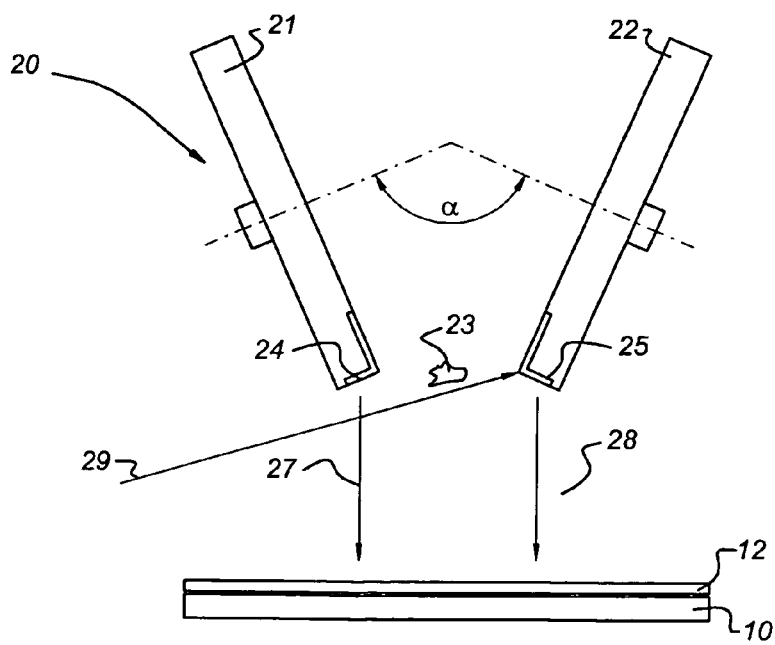

US 7,759,663 B1

SELF-SHADING ELECTRODES FOR DEBRIS SUPPRESSION IN AN EUV SOURCE

FIELD

The present invention relates to a electrically-operated discharge source, a lithographic apparatus and a method for producing radiation by means of an electrically-operated discharge source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to decrease the critical dimension of devices, a lithographic projection apparatus may be arranged with an EUV radiation source. The EUV radiation source may be, for example, a discharge plasma radiation source, in which a plasma is generated in a substance (for instance, a gas or vapor) between an anode and a cathode and in which a high temperature discharge plasma may be created by ohmic heating caused by a (pulsed) current flowing through the plasma. In addition to in-band EUV radiation, a practical EUV source also generates out-of-band radiation and debris, the latter of which severely limits the operational lifetime of reflective optics close to the radiation source. In the case of a Sn-based source, three types of debris can be distinguished:

slow atomic debris: thermalized atoms, i.e. with random direction and velocity according to the Maxwell distribution;
fast atomic debris: ions, neutrals and nano clusters with a high ballistic velocity substantially parallel to the EUV radiation emitted by the source;
micro-particles: micrometer-sized ballistic particles and droplets, also directed substantially parallel to the EUV radiation.

Fast atomic debris reduce the reflectivity of the subsequent optics by etching, whereas slow atomic debris and micro-particles reduce the reflectivity by contaminating the surface. Either debris resistant components or debris mitigation or cleaning strategies should therefore be used in order to maintain sufficient output power in the EUV lithography tool.

PCT patent application publication WO 2005/025280 describes an EUV radiation source in which the anode and the cathode are formed by wheels that are wetted in a bath containing a liquid metal, such as Sn. Some of the debris is picked up by the thin film on the electrodes and transported back to the bath. Most of the debris however is directed towards the optics of the lithographic apparatus. This debris may be deflected by an additional electrode arrangement of thin metal sheets to which a voltage of several thousands of volts is applied.

SUMMARY

It is desirable, for example, to reduce or prevent micro-particles originating from an electrode of a plasma radiation source from reaching the EUV optics.

According to an aspect of the invention, there is provided an electrically-operated discharge source for producing radiation, comprising at least two electrodes arranged in a discharge space at a distance from one another which allows formation of a plasma at a point between respective active areas of the electrodes, wherein in a situation in which an optical axis of an optical element to be radiated intersects the point, at least one of the respective active areas is not in a direction of propagation of micro-particles or other debris for at least a specific part of the optical element while the specific part does receive radiation from the plasma at the point.

In an embodiment, the radiation source further comprises a device configured to apply a metal melt to a surface of the electrodes and an energy beam device arranged to direct an energy beam onto at least one of the active areas to evaporate the applied metal melt to at least partially produce a gaseous medium.

In an embodiment, a cross section of a part of at least one of the electrodes is wedge shaped.

In an embodiment, each of the electrodes comprises a notch and the active areas are in the notches and further comprising an energy beam device arranged to direct an energy beam onto at least one of the notches In an embodiment, each of the electrodes may be rotatably mounted around an axis of rotation.

According to a further aspect, there is provided a lithographic apparatus, comprising:

an electrically-operated discharge source configured to produce radiation, the source comprising at least two electrodes arranged in a discharge space at a distance from one another which allows formation of a plasma at a point between respective active areas of the electrodes;

an illumination system configured to condition a radiation beam, the illumination system comprising an optical element facing the discharge source, wherein an optical axis of the optical element intersects the point;

a support constructed to support a patterning device, the patterning device configured to impart the radiation beam with a pattern in its cross-section to form a patterned radiation beam;

a substrate table constructed to hold a substrate; and a projection system configured to project the patterned radiation beam onto a target portion of the substrate, wherein at least one of the respective areas is not in a direction of propagation of micro-particles or other debris for at least a specific part of the optical element while the specific part, at least in use, receives radiation from the point.

According to a further aspect of the invention, there is provided a method for producing radiation, comprising:

forming a plasma at a point between respective active areas of at least two electrodes arranged in a discharge space of an electrically-operated discharge source;

emitting radiation from the point toward at least a specific part of an optical element; and propagating micro-particles or other debris caused by the plasma in a direction toward substantially only another part of the optical element different from the specific part.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 depicts a lithographic apparatus according to an embodiment of the invention;

FIG. 2 is a cross sectional view of a part of a plasma radiation source according to the state of the art;

DETAILED DESCRIPTION

Figure 3:
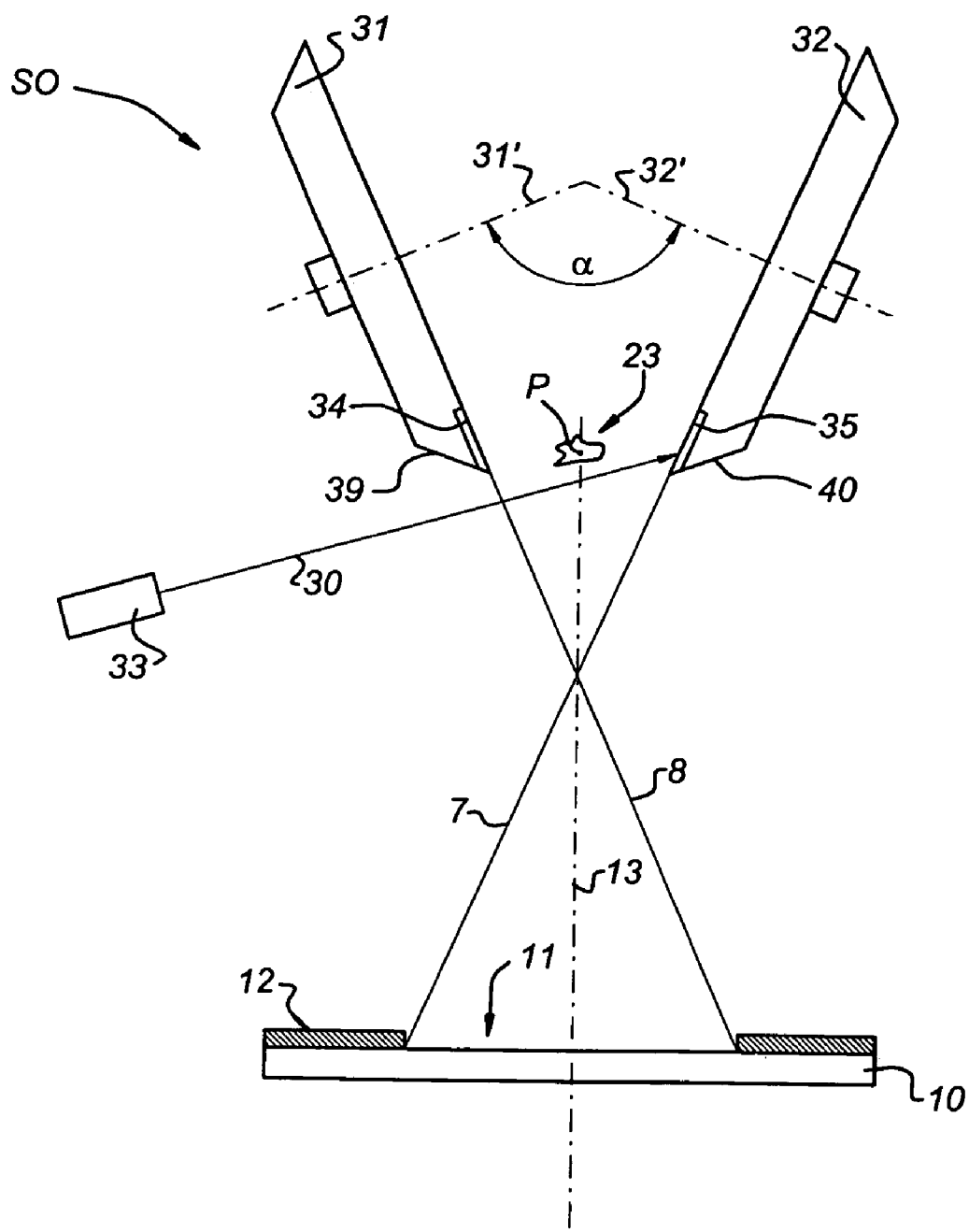
FIG. 3 is a cross sectional view of a part of a plasma radiation source according to an embodiment of the invention.

FIG. 1 schematically depicts a lithographic apparatus according to one embodiment of the invention. The apparatus comprises:

plasma radiation source SO arranged to produce EUV radiation;

a contamination barrier CB arranged to block part of the contamination coming from the radiation source SO;

an illumination system (illuminator) IL configured to condition a radiation beam B;

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO via a contamination barrier CB. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 diagrammatically shows part of an EUV source 20 according to the state of the art. The EUV source 20 comprises an anode 21 and a cathode 22 made of, for example, Mo. The anode 21 and cathode 22, also referred to as electrodes 21, 22, may be turnable wheels in contact with a metal melt (not shown) as described in PCT patent application publication WO 2005/025280, incorporated herein in its entirety by reference. In that case, the electrodes 21, 22 have respective axes of rotation that make an angle α as shown in FIG. 2. A laser beam 29 is used to hit the cathode 22 so as to generate a plasma (e.g., a Sn plasma), and an EUV pinch 23.

In addition to in-band EUV radiation, the EUV source 20 also generates out-of-band radiation and debris, the latter of which severely limits the operational lifetime of reflective optics close to the EUV source 20. As noted above, in the case of Sn-based sources, three types of debris can be distinguished, namely slow atomic debris, fast atomic debris, and micro-particles. An embodiment of the present invention mainly concentrates on micro-particles.

Most of micro-particles originate from the anode 21 and cathode 22 of the EUV source 20, in particular from the areas 24 and 25 between which the discharge takes place as shown in FIG. 2. For the purpose of this document, the areas 24, 25 are called "active areas". The active areas are those areas of the electrodes 21, 22 through which an electrical discharge current passes. The debris particles will leave the EUV source 20 and will travel towards an optical component 10 (in this example a mirror 10), as indicated with arrows 27 and 28. With reference number 12 it has been indicated that in this case the entire surface of the mirror 10 will become contaminated in this way.

FIG. 3 shows a cross sectional view of a part of a plasma radiation source SO according to an embodiment of the invention in which due to the specific configuration of the plasma radiation source SO, a specific part 11 of the mirror 10 is substantially not contaminated by the micro-particles. FIG. 3 also shows an optical axis 13 of the mirror 10 which intersects the point P of the plasma 23. FIG. 3 shows two electrodes 31, 32 respectively, which have the form of a wheel with a wedge-shaped cross section and can be rotated around axes of rotation indicated with dashed lines 31' and 32'. The radiation source SO further comprises a device to apply a metal melt to a surface of the electrodes 31, 32. The device may be a bath containing a liquid metal, as described in publication PCT patent application publication WO 2005/025280. The liquid metal may be, for example, Sn. The electrodes 31, 32 may comprise Mo.

An energy beam device 33 is arranged to direct an energy beam 30 onto a surface of the electrode 32. During operation, a plasma 23 is produced and, due to electrical fields, pinched in a point P between the electrodes 31, 32 producing radiation that leaves the radiation source SO.

The active areas, as indicated with reference numbers 34, 35, produce micro-particles and/or other debris due to the electrical discharge that occurs between these areas and which micro-particles and/or other debris propagates therefrom. According to an embodiment of the invention, the electrodes 31, 32 have such a configuration that the active areas of the electrodes 31, 32 are not in a direction of the propagation for at least a specific part 11 of the optical element 10 while the specific part 11 does receive radiation from the point P.

Due to the configuration of the electrodes 31, 32 shown in FIG. 3, the total electrode surface area generating, for example, micro-particles is significantly reduced. The surface of the rims indicated with numbers 39 and 40 will now not substantially generate micro-particles, because they are outside the illumination area of the EUV pinch 23. The electrodes 31, 32 are internally shading the rims 39, 40 from the EUV pinch 23.

The parts that can still generate micro-particles are indicated with numbers 34 and 35. However, the micro-particles from the areas 34, 35 are internally blocked by the electrodes 31, 32, due to which substantially only outer parts of the mirror 10 become contaminated by the micro-particles, as indicated with the shaded portion 12. The area that is substantially free of micro-particles is defined by the lines 7 and 8 in FIG. 3. In this area, the infinite point I is just one point that is free of micro-particles.

The angle $\alpha$ between the axes of rotation determines the area on the mirror 10 within which the micro-particles are blocked. Thus, by decreasing the angle $\alpha$, one can block more and more of the micro-particles. In an embodiment, the angle $180°$-$\alpha$ is equal to a collection angle of the illuminator IL, such that substantially all micro-particles generated at the electrodes are internally blocked by the electrodes 31, 32 and a contamination barrier CB may not be needed. However, when the angle $\alpha$ is decreased so as to block more micro-particles, the area enclosed by the discharge circuit of the plasma radiation source increases, which in turn increases the self-inductance of the discharge circuit. Care should be taken that this self-inductance remains small enough to allow for fast voltage pulses. Typically, a value smaller than 15 nH is required. In the configuration of FIG. 3, not the entire collection angle can be protected with self-shading, leaving the part of the mirror 10 indicated with the shaded area 12 unprotected. This unprotected area may be protected with a contamination barrier (e.g., a foil trap).

In the embodiment shown in FIG. 3, the extent of self-shading depends on the sharpness of the edges of the electrodes 31, 32, which edges are defined by the inner surfaces of the electrodes 31, 32 facing each other and the rims 39, 40 respectively. These edges are particularly susceptible to damage by electrode sputtering as caused by the discharge between the electrodes 31, 32, and may therefore become rounded during the course of operation. This results in some unwanted micro-particles generated from these rounded parts. However, even with rounded electrodes, there is still a significant amount of debris suppression as compared to the state of the art, because only the rounded part will generate debris and the rest of the rims 39 and 40 is still shaded.

Figure 4:
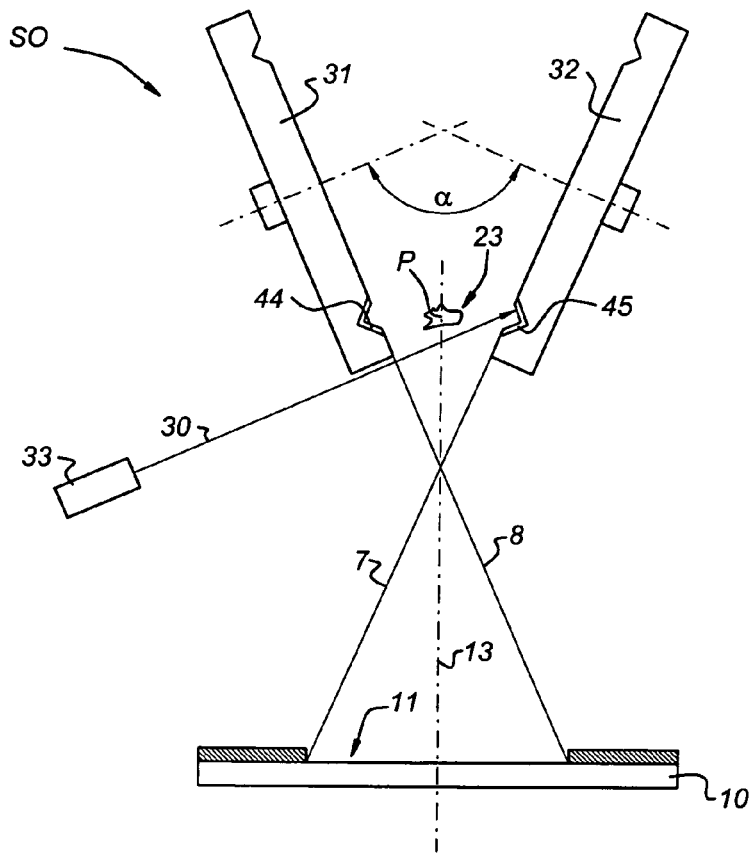
FIG. 4 is a cross sectional view of a part of a plasma radiation source according to a further embodiment of the invention.

FIG. 4 is a cross sectional view of a part of a plasma radiation source according to a further embodiment of the invention. In FIG. 4, the plasma radiation source SO comprises electrodes 31, 32 which are notched 44, 45. The laser beam 30 is directed towards a notch 45 in electrode 32, that is covered by a film of liquid metal (e.g., Sn) by rotating the electrode 32 through a liquid metal bath, in such a way that metal vapor is produced and travels towards another notch 44 in electrode 31 opposing notch 45 in electrode 32. This helps ensure that the EUV pinch 23 is established between the notches 44, 45 as shown in FIG. 4. In this way, the same self-shading effect is achieved as described above, while the electrodes 31, 32 are less vulnerable to sputtering damage.

Figure 5:
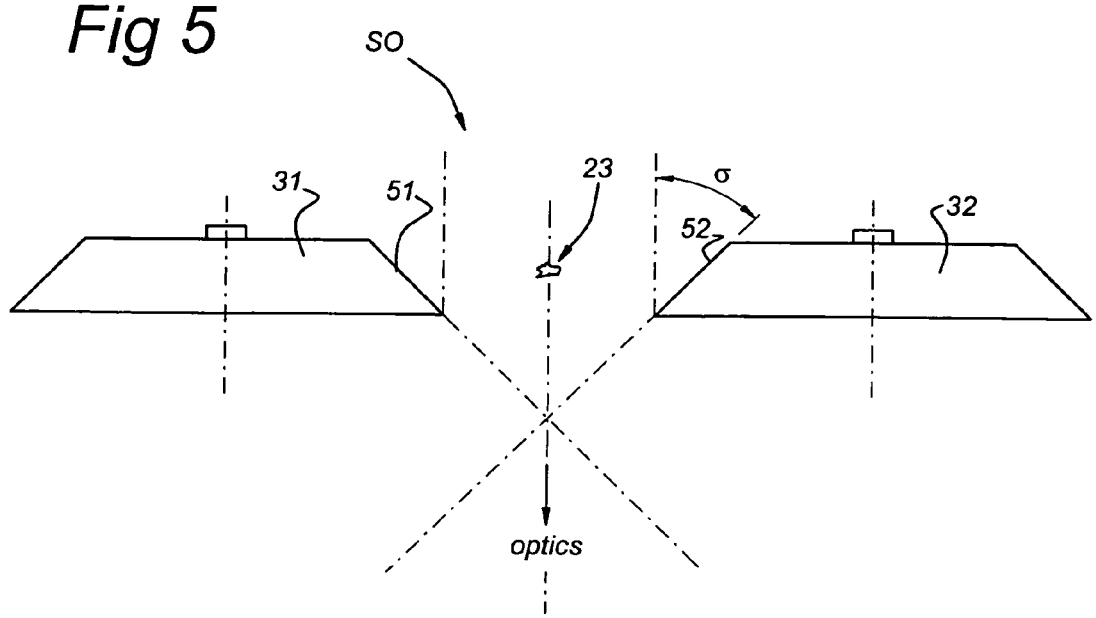
FIG. 5 is a cross sectional view of a part of a plasma radiation source according to a further embodiment of the invention.

FIG. 5 is a cross sectional view of a part of a plasma radiation source according to a further embodiment of the invention wherein two electrodes 31, 32 are lying in a plane, i.e. $\alpha$=0 and the axes of rotation are substantially parallel to one another. Both electrodes 31, 32 have wedge shaped rims 51, 52 with the angled surface not facing the optics (e.g. the illuminator IL). In this embodiment, the area which is free of micro particles is determined by an angle $\sigma$ as shown in FIG. 5. Typical values for a lie between $40°$ and $85°$, and will depend on the configuration of the optics receiving the radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams. It is noted that the term "EUV radiation" herein also encompasses soft X-ray radiation.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. Instead of Sn, another type of metal may be used in the plasma source. The descriptions above are intended to be illustrative, not limiting. Thus, it will be apparent to one skilled in the art that modifications may be made to the invention as described without departing from the scope of the claims set out below.

The invention claimed is:

1. An electrically-operated discharge source for producing radiation, comprising at least two electrodes arranged in a discharge space at a distance from one another which allows formation of a plasma at a point between respective active areas of the electrodes, wherein each of the electrodes is constructed and arranged to internally block micro-particles and debris generated from at least one of the respective active areas from propagating to a part of an optical element that is configured to receive radiation from the point, wherein each of the electrodes having an axis of rotation at a center is disposed such that an angle between the axes of the electrodes determines an area on the optical element within which the micro-particles and debris are blocked.

2. The source of claim 1, wherein the electrodes are constructed and arranged to internally block micro-particles and debris generated from both the respective active areas with, wherein each electrode having an end that is shaped to block micro-particles and debris.

3. An electrically-operated discharge source for producing radiation, comprising at least two electrodes arranged in a discharge space at a distance from one another which allows formation of a plasma at a point between respective active areas of the electrodes, wherein each of the electrodes is constructed and arranged to internally block micro-particles and debris generated from at least one of the respective active areas from propagating to a part of an optical element that is configured to receive radiation from the point, the source further comprising a device configured to apply a metal melt to a surface of the electrodes and an energy beam device arranged to direct an energy beam onto at least one of the active areas to evaporate the applied metal melt to at least partially produce a gaseous medium.

4. The source of claim 3, wherein a cross section of a part of at least one of the electrodes is wedge shaped.

5. The source of claim 3, wherein each of the electrodes comprises a notch and the active areas are in the notches and further comprising an energy beam device arranged to direct an energy beam onto at least one of the notches.

6. The source of claim 3, wherein each of the electrodes is rotatably mounted around a respective axis of rotation.

7. A radiation system, comprising:
an optical element having an optical axis; and
an electrically-operated discharge source configured to produce radiation, the source comprising at least two electrodes arranged in a discharge space at a distance from one another which allows formation of a plasma in a point between respective active areas of the electrodes, wherein each of the electrodes is constructed and arranged to internally block micro-particles and debris generated from at least one of the respective active areas from propagating to a part of an optical element that is configured to receive radiation from the point, wherein each of the electrodes having an axis at a center is disposed such that a variable angle between the axes of the electrodes determines an area on the optical element within which the micro-particles and debris are blocked.

8. The radiation system of claim 7, wherein the electrodes are constructed and arranged to internally block micro-particles and debris generated from both the respective active areas, wherein each electrode having an end that is shaped to block micro-particles and debris.

9. A radiation system, comprising:
an optical element having an optical axis; and
an electrically-operated discharge source configured to produce radiation, the source comprising at least two electrodes arranged in a discharge space at a distance from one another which allows formation of a plasma in a point between respective active areas of the electrodes, wherein each of the electrodes is constructed and arranged to internally block micro-particles and debris generated from at least one of the respective active areas from propagating to a part of an optical element that is configured to receive radiation from the point, the radiation system further comprising a device configured to apply a metal melt to a surface of the electrodes and an energy beam device arranged to direct an energy beam onto at feast one of the active areas to evaporate the applied metal melt to at least partially produce a gaseous medium.

10. The radiation system of claim 9, wherein a cross section of a part of at least one of the electrodes is wedge shaped.

11. The radiation system of claim 9, wherein each of the electrodes comprises a notch and the active areas are in the notches and further comprising an energy beam device arranged to direct an energy beam onto at least one of the notches.

12. The radiation system of claim 9, wherein each of the electrodes is rotatably mounted around a respective axis of rotation.

13. A method for producing radiation, comprising:
forming a plasma at a point between respective active areas of at least two electrodes arranged in a discharge space of an electrically-operated discharge source;
emitting radiation from the point toward at least a specific part of an optical element; and
propagating micro-particles or other debris caused by the plasma in a direction toward substantially only another part of the optical element different from the specific part.

14. The method of claim 13, wherein both the respective active areas are in the direction of propagation of the micro-particles or other debris toward the another part.

15. The method of claim 13, further comprising applying a metal melt to a surface of the electrodes and directing an energy beam onto at least one of the active areas to evaporate the applied metal melt to at least partially produce a gaseous medium.

16. The method of claim 13, wherein a cross section of a part of at least one of the electrodes is wedge shaped.

17. The method of claim 13, wherein each of the electrodes comprises a notch and the active areas are in the notches, and further comprising directing an energy beam onto at least one of the notches.

18. The method of claim 13, wherein each of the electrodes is rotatably mounted around a respective axis of rotation.

19. The source of claim 1, wherein each of the electrodes having a wedge shaped rim with an angled surface not facing the optical element.

20. The source of claim 1, wherein the angle between the axes of the electrodes being less than 180 degree.

* * * * *